(12) United States Patent
Guo

(10) Patent No.: US 12,302,549 B2
(45) Date of Patent: May 13, 2025

(54) SEMICONDUCTOR MEMORY STRUCTURE

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 417 days.

(21) Appl. No.: 17/661,349

(22) Filed: Apr. 29, 2022

(65) Prior Publication Data

US 2023/0138466 A1 May 4, 2023

(30) Foreign Application Priority Data

Nov. 2, 2021 (CN) .......................... 202111296771.6

(51) Int. Cl.
*H10B 12/00* (2023.01)

(52) U.S. Cl.
CPC .............. *H10B 12/30* (2023.02); *H10B 12/05* (2023.02); *H10B 12/482* (2023.02); *H10B 12/488* (2023.02)

(58) Field of Classification Search
CPC ...... H10B 12/30; H10B 12/05; H10B 12/482; H10B 12/488; H01L 21/764; H01L 29/0649

See application file for complete search history.

(56) References Cited

U.S. PATENT DOCUMENTS

| | | | | |
|---|---|---|---|---|
| 2011/0309430 A1* | 12/2011 | Purayath | ............ | H01L 21/7682 |
| | | | | 257/E21.573 |
| 2013/0146958 A1* | 6/2013 | Kim | .................... | H10B 12/488 |
| | | | | 257/E29.345 |
| 2013/0307044 A1* | 11/2013 | Kinoshita | ......... | H01L 29/66825 |
| | | | | 257/E21.573 |
| 2016/0293839 A1* | 10/2016 | Suzuki | ................ | H10N 70/823 |

FOREIGN PATENT DOCUMENTS

CN 108511454 A 9/2018

* cited by examiner

*Primary Examiner* — Shouxiang Hu
(74) *Attorney, Agent, or Firm* — SYNCODA LLC; Feng Ma

(57) ABSTRACT

A semiconductor structure, a forming method thereof and a memory are provided. Wherein the semiconductor structure includes: a substrate; a bit line layer, located in the substrate; a word line stack layer, located on the substrate, wherein the word line stack layer includes a word line layer; and a gap, located between the bit line layer and the word line layer.

5 Claims, 7 Drawing Sheets

ND STRUCTURE

SEMICONDUCTOR MEMORY STRUCTURE

CROSS-REFERENCE TO RELATED APPLICATIONS

This application claims the priority of Chinese Patent Application No. 202111296771.6, submitted to the Chinese Intellectual Property Office on Nov. 2, 2021, the disclosure of which is incorporated herein in its entirety by reference.

TECHNICAL FIELD

The present disclosure relates to the technical field of semiconductors, and in particular to a semiconductor structure, a forming method thereof and a memory.

BACKGROUND

With the development of the semiconductor industry, the critical dimension of devices decreases continuously. To achieve higher memory density, the capacitor line width needs to be reduced. However, as the capacitor line width decreases, the capacitance will also decrease and the storage capacitance will further decrease relative to the parasitic capacitance of bit lines, ultimately causing signals for data storage to be indistinguishable.

SUMMARY

Embodiments of the present disclosure provide a semiconductor structure, a forming method thereof and a memory.

A first aspect, an embodiment of the present disclosure provides a semiconductor structure, including:
  a substrate;
  a bit line layer, located in the substrate;
  a word line stack layer, located on the substrate, wherein the word line stack layer includes a word line layer; and
  a gap, located between the bit line layer and the word line layer.

A second aspect, an embodiment of the present disclosure provides a method of forming a semiconductor structure, including:
  providing a substrate;
  forming a bit line layer in the substrate;
  forming a word line stack layer on the substrate, wherein the word line stack layer includes a word line layer; and
  forming a gap between the bit line layer and the word line layer.

A third aspect, an embodiment of the present disclosure provides a memory, including the semiconductor structure according to any one of the foregoing embodiments.

Details of one or more embodiments of the present disclosure are proposed in the following drawings and description. Other features and advantages of the present disclosure will become evident from the specification, accompanying drawings, and claims.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description merely show some embodiments of the present disclosure, and a person of ordinary skill in the art may still derive other drawings from these drawings without creative efforts.

DETAILED DESCRIPTION

Figure 1:
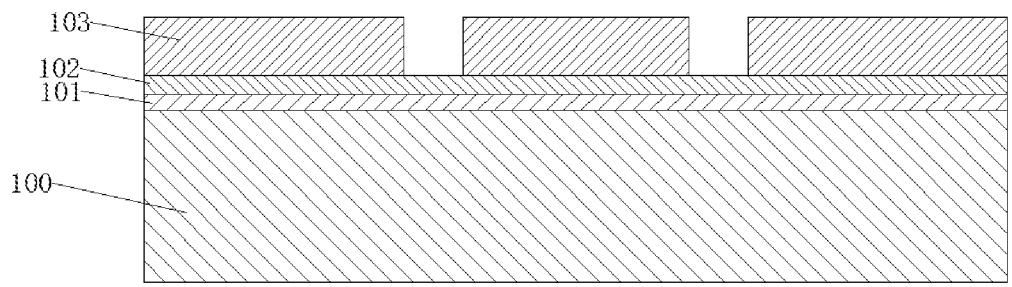
FIG. 1 to FIG. 6 are cross-sectional schematic structural diagrams of a semiconductor structure according to different embodiments of the present disclosure.

To make persons skilled in the art better understand the present disclosure, the following clearly and completely describes the technical solutions in the embodiments of the present disclosure. Apparently, the described embodiments are merely some rather than all of the embodiments of the present disclosure. All other embodiments obtained by those of ordinary skill in the art based on the embodiments of the present disclosure without creative efforts should fall within the protection scope of the present disclosure.

The terms "first", "second", and the like in the specification, claims and the accompanying drawings of the present disclosure are intended to distinguish between different objects but do not indicate a specific sequence. Moreover, the terms "include", "have", and any variations thereof mean to cover non-exclusive inclusion. For example, a process, method, system, product, or device that includes a list of steps or units is not necessarily limited to those steps or units which are listed, but optionally may further include other steps or units which are not listed or inherent to such a process, method, system, product, or device.

The "embodiment" mentioned herein means that a specific feature, structure, or characteristic described in combination with the embodiment may be included in at least one embodiment of the present disclosure. The phrase appearing in different parts of the specification does not necessarily refer to the same embodiment or an independent or alternative embodiment exclusive of other embodiments. It may be explicitly or implicitly appreciated by those skilled in the art that the embodiment described herein may be combined with other embodiments.

As shown in FIG. 17 to FIG. 20, an embodiment of the present disclosure provides a semiconductor structure, including:
  a substrate 100;
  a bit line layer 200, located in the substrate 100;
  a word line stack layer 300, located on the substrate 100, where the word line stack layer 300 includes a word line layer 310; and
  a gap 400, located between the bit line layer 200 and the word line layer 310.

The semiconductor structure provided by this embodiment of the present disclosure includes a substrate 100. A bit line layer 200 is provided in the substrate 100, a word line layer 310 is provided on the substrate 100, and a gap 400 is provided between the bit line layer 200 and the word line layer 310. In the semiconductor structure provided by this embodiment of the present disclosure, the gap 400 is provided between the bit line layer 200 and the word line layer 310. Gas or vacuum in the gap 400 has a relatively low dielectric constant, so that bit lines can be effectively decoupled from word lines, thereby reducing the parasitic capacitance of the bit lines. This can further reduce the line width of a memory capacitor, to satisfy the development trend of miniaturization.

Specifically, the substrate 100 may be, but is not limited to, a silicon substrate 100. For example, a material of the substrate 100 may be any one of or a mixture of more than one of silicon crystal, germanium crystal, a silicon-on-insulator structure, an epitaxial-layer-on-silicon structure, a compound semiconductor, or an alloy semiconductor. The compound semiconductor is any one of or a mixture of more than one of silicon carbide, gallium arsenide, gallium phosphide, indium phosphide, indium arsenide, or indium dysprosium. The alloy semiconductor is any one of or a mixture of more than one of SiGe, GaAsP, AlInAs, AlGaAs, GaInAs, GaInP, or GaInAsP. In this specific implementation, the substrate 100 being a silicon substrate 100 is used as an example for description.

The substrate 100 further includes an isolation region 110. The isolation region 110 may be a shallow trench isolation (STI) structure. A material of the STI structure may include silicon oxide, silicon nitride or the like. A cross-sectional shape of the STI structure is not limited. For example, the cross-sectional shape of the STI structure may be a trapezoid. In other specific implementations, the bottom of the STI structure is a curved surface, that is, the bottom of the cross-sectional shape of the STI structure is a downward-concave curve.

In the semiconductor structure in this embodiment of the present disclosure, the word line stack layer 300 may further include an insulating layer in addition to the word line layer 310. The material of the insulating layer is not limited, and may be, for example, an oxide or a nitride.

In some embodiments, the word line stack layer 300 further includes: an insulating layer, located between the word line layer 310 and the bit line layer 200. One or two insulating layers may be provided between the word line layer 310 and the bit line layer 200. When one insulating layer is provided, the insulating layer may be closer to the bit line layer 200 relative to the gap 400, or closer to the word line layer 310 relative to the gap 400. By providing the insulating layer between the word line layer 310 and the bit line layer 200, the parasitic capacitance of the bit lines can be reduced.

In an exemplary embodiment, the insulating layer includes a first insulating layer 330 and a second insulating layer 320, where the first insulating layer 330 is located on the bit line layer 200. The second insulating layer 320 is located under the word line layer 310. The gap 400 is located between the first insulating layer 330 and the second insulating layer 320.

Figure 17:
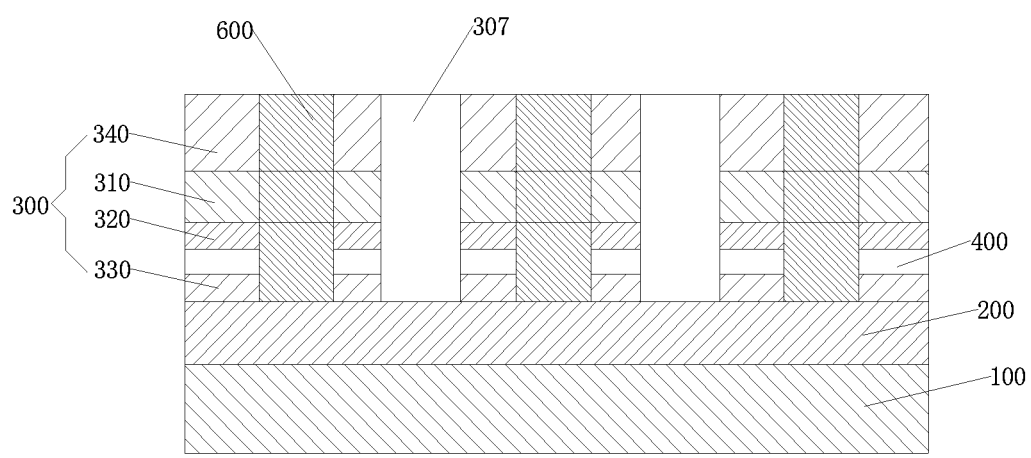
Figure 19:
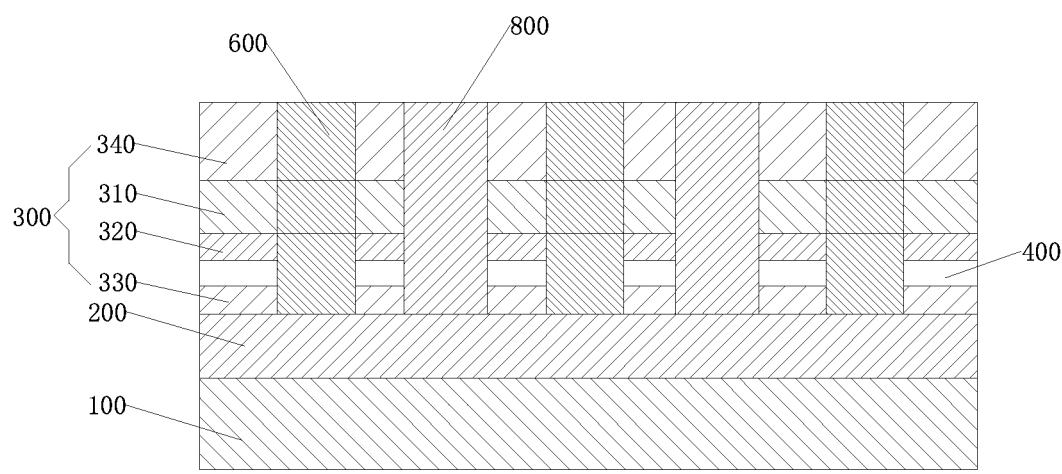
Figure 20:
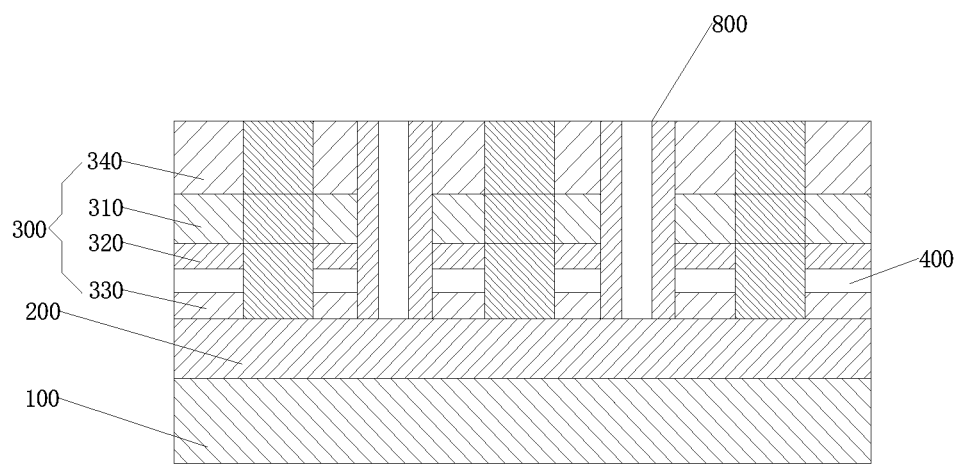

In some embodiments, referring to FIG. 17, the semiconductor structure further includes a word line isolation recess 307. The word line isolation recess 307 is located in the stack layer, and the word line isolation recess 307 isolates two adjacent word lines. Referring to FIG. 19 and FIG. 20, an isolation layer 800 is provided in the word line isolation recess 307. The isolation layer 800 is located in the word line isolation recess 307, to isolate word lines, so as to reduce the parasitic capacitance of the word lines.

A specific shape of the isolation layer 800 in the word line isolation recess 307 is not limited.

In some embodiments, referring to FIG. 19, the isolation layer 800 fills the word line isolation recess 307, and the isolation layer 800 is of a solid structure.

In some embodiments, referring to FIG. 20, the isolation layer 800 is located on a recess wall of the word line isolation recess 307, and the isolation layer 800 is of a hollow structure. A hollow part inside the isolation layer 800 has a relatively low dielectric constant, which can reduce the parasitic capacitance.

In some embodiments, the semiconductor structure further includes a transistor 600. The transistor 600 penetrates the word line stack layer 300. A bottom of the transistor 600 is connected to a bit line. In an exemplary embodiment, referring to FIG. 18, the transistor 600 includes a source 630, a channel region 620, and a drain 610 sequentially stacked on the bit line. The source 630 of the transistor 600 is connected to the bit line. The transistor 600 may be formed through SEG and doping. The channel region 620 may correspond to the word line layer 310; the source 630 and the drain 610 may be doped with other elements according to specific situations. In an exemplary embodiment, the transistor 600 includes three parts from bottom to top: the source 630, the channel region 620, and the drain 610. The channel region 620 corresponds to the word line layer 310, the drain 610 is located on the channel region 620, the source 630 is located under the channel region 620, and the source 630 is in contact with the bit line.

Figure 21:
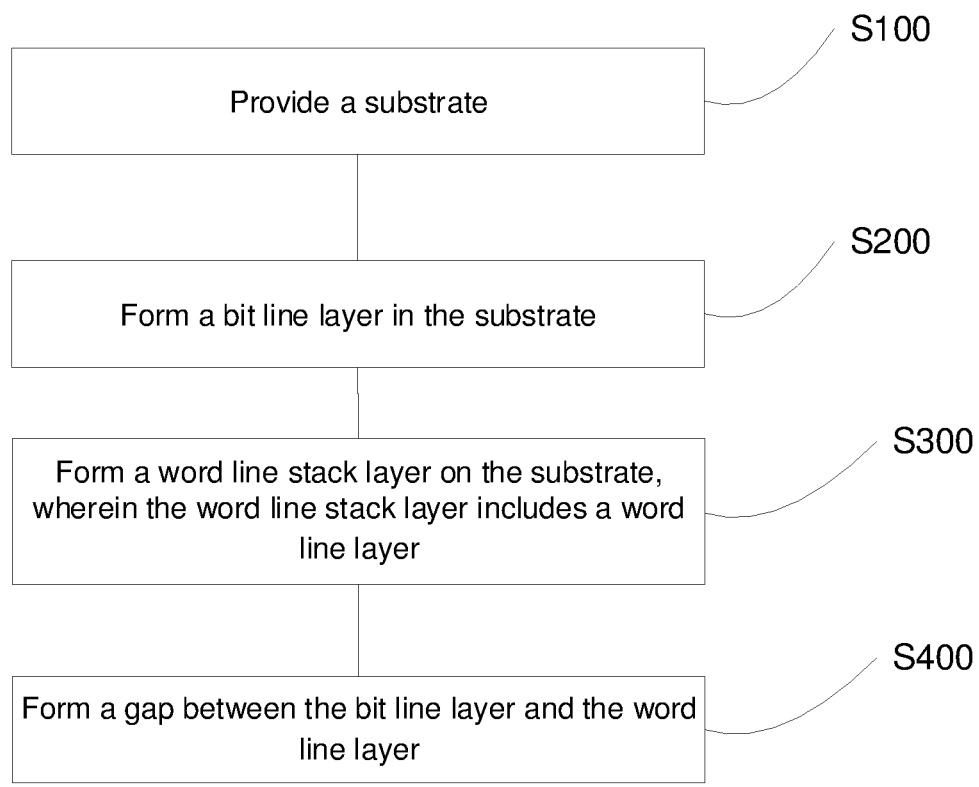
FIG. 21 is a schematic flowchart of a method of forming a semiconductor structure according to an embodiment of the present disclosure.

An embodiment of the present disclosure provides a method of forming a semiconductor structure. The semiconductor structure in any one of the foregoing embodiments can be obtained using this method. The method embodiments below can be used to help understand the semiconductor structure described above. The foregoing embodiments of the semiconductor structure can also be used to help understand the following method of forming a semiconductor structure. FIG. 21 is a flowchart of an embodiment of a method of forming a semiconductor structure according to the present disclosure. Referring to FIG. 21, the forming method includes the following steps:

S100: Provide a substrate 100.

S200: Form a bit line layer 200 in the substrate 100.

S300: Form a word line stack layer 300 on the substrate 100, where the word line stack layer 300 includes a word line layer 310.

S400: Form a gap 400 between the bit line layer 200 and the word line layer 310.

In the method of forming a semiconductor structure provided by this embodiment of the present disclosure, a bit line layer 200 is formed in the substrate 100, a word line layer 310 is formed on the substrate 100, and a gap 400 is formed between the bit line layer 200 and the word line layer 310. In the semiconductor structure provided by the embodiments of the present disclosure, the gap 400 is formed between the bit line layer 200 and the word line layer 310. Gas or vacuum in the gap 400 has a relatively low dielectric constant, and the bit line layer 200 is decoupled from the word line layer 310, so that bit lines can be effectively decoupled from word lines, thereby reducing the parasitic capacitance of the bit lines. This can further reduce the line width of a memory capacitor, to satisfy the development trend of miniaturization.

In the embodiments of the present disclosure, the substrate 100 may be, but is not limited to, a silicon substrate 100. For example, a material of the substrate 100 may be any one of or a mixture of more than one of silicon crystal, germanium crystal, a silicon-on-insulator structure, an epitaxial-layer-on-silicon structure, a compound semiconductor, or an alloy semiconductor. The compound semiconductor is any one of or a mixture of more than one of silicon carbide, gallium arsenide, gallium phosphide, indium phosphide, indium arsenide, or indium dysprosium. The alloy semiconductor is any one of or a mixture of more than one of SiGe, GaAsP, AlInAs, AlGaAs, GaInAs, GaInP, or GaInAsP.

The method of forming a semiconductor structure provided by the embodiments of the present disclosure further includes forming an isolation region 110 on the substrate 100. The isolation region 110 may be formed by using an STI process.

In an exemplary embodiment, the step of forming an isolation region 110 on the substrate 100 includes: forming a trench 104 on the substrate 100; and forming an isolation material layer 105 in the trench 104.

Referring to FIG. 1, an oxide layer 101 and a first hard mask layer 102 are sequentially provided on the surface of the substrate 100, and a first photoresist layer 103 is provided on the first hard mask layer 102.

Figure 2:
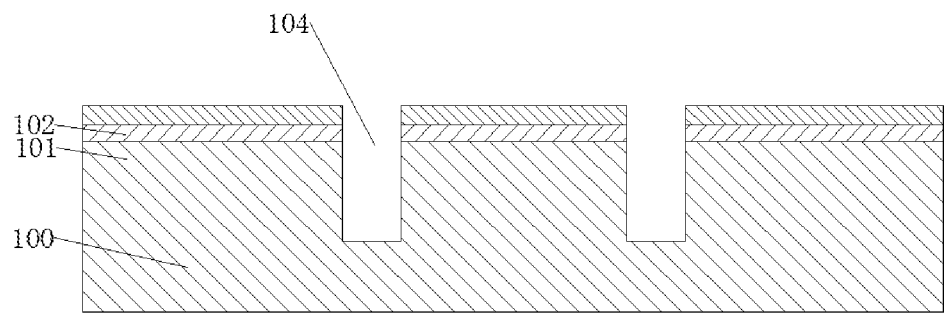
Figure 3:
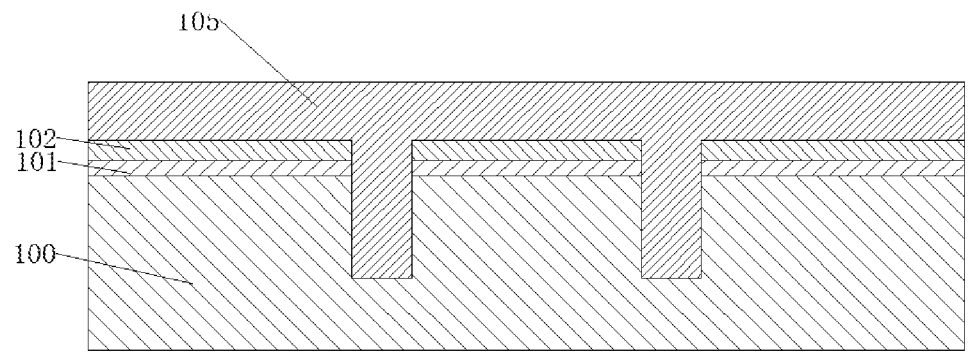
Figure 4:
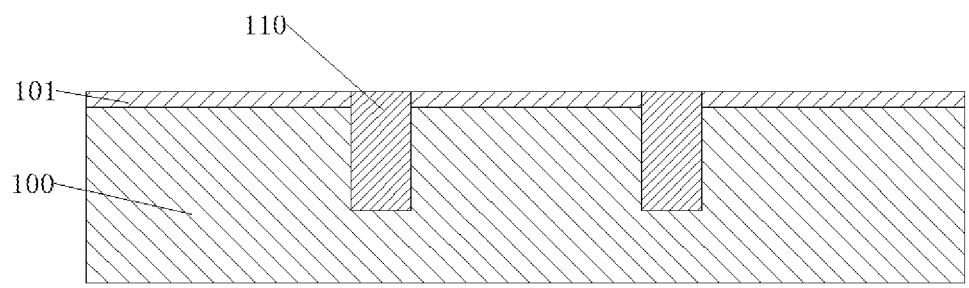

In a specific implementation of forming the trench 104 on the substrate 100, a pattern is defined on the first photoresist layer 103, and the first hard mask layer 102 and the oxide layer 101 are sequentially etched with the patterned first photoresist layer 103 as a mask; then, the substrate 100 is etched with the patterned first hard mask layer 102 and the oxide layer 101 as a mask, to form the trench 104 on the substrate 100, and the first photoresist layer 103 is removed to obtain the structure shown in FIG. 2. The pattern defined in this structure can be directly defined through illumination, or may be implemented by performing a pitch double method on a pattern that is defined through illumination. An isolation material is injected into the trench 104 to form the isolation material layer 105, thus obtaining the structure shown in FIG. 3. The isolation material layer 105 and the first hard mask layer 102 outside the trench 104 are removed, and the isolation region 110 is formed in the substrate 100, to obtain the structure shown in FIG. 4.

In an exemplary embodiment, the isolation region 110 adopts an STI structure. A material of the STI structure may include silicon oxide, silicon nitride or the like. A cross-sectional shape of the STI structure is not limited. For example, the cross-sectional shape of the STI structure may be a trapezoid. In other specific implementations, the bottom of the STI structure is a curved surface, that is, the bottom of the cross-sectional shape of the STI structure is a downward-concave curve.

In some embodiments, the step of forming a bit line layer 200 in the substrate 100 includes: forming openings 210 on the substrate 100; and forming a bit line in each of the openings 210. The bit line layer 200 consists of a plurality of bit lines.

Figure 5:
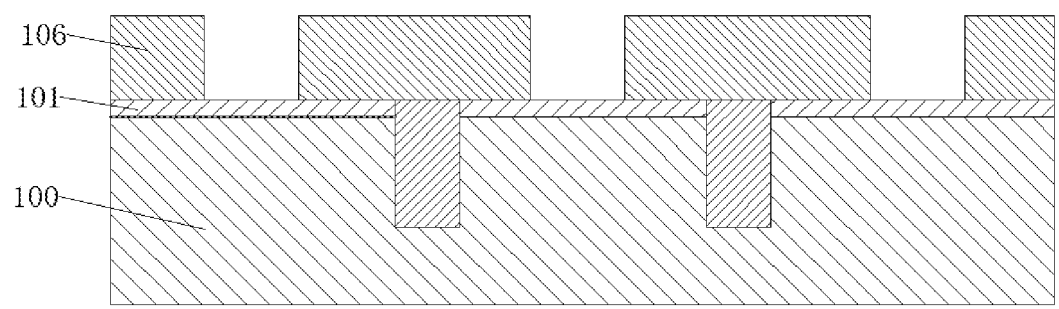
Figure 6:
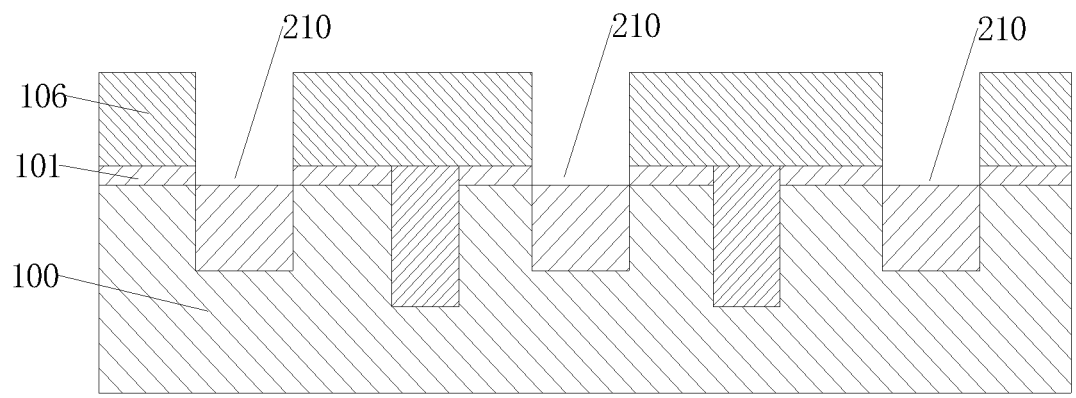
Figure 7:
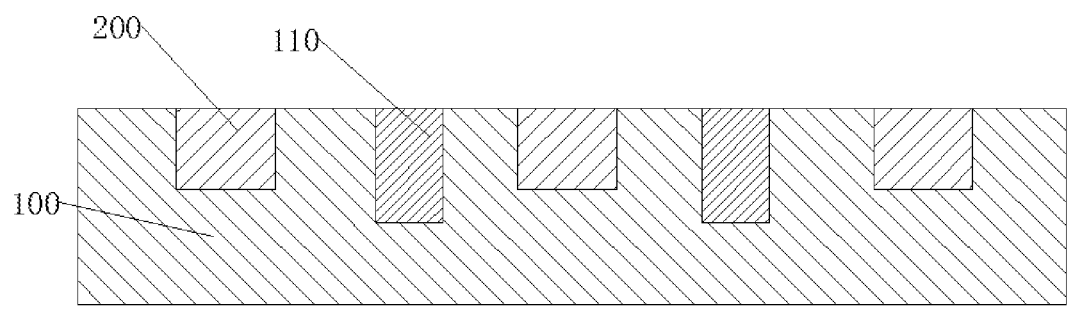
FIG. 7 to FIG. 20 are cross-sectional schematic structural diagrams of a semiconductor structure during various phases in a forming process according to an embodiment the present disclosure.

In a specific implementation of forming the bit line layer 200 in the substrate 100, referring to FIG. 5, a second photoresist layer 106 is provided on the substrate 100, a pattern is defined on the second photoresist layer 106, and the oxide layer 101 is etched with the patterned second photoresist layer 106 as a mask, to transfer the pattern of the second photoresist layer 106 to the oxide layer 101, thereby forming the openings 210 that expose the substrate 100. The pattern defined in this structure can be directly defined through illumination, or may be implemented by performing a pitch double method on a pattern that is defined through illumination. Ion implantation (IMP) is performed on the substrate 100 through the openings 210, to obtain the structure shown in FIG. 6. Bit lines are formed in the substrate 100, and the second photoresist layer 106 and the oxide layer 101 are removed, so that a top surface of the substrate 100 is flush with a top surface of the bit line layer 200, to obtain the structure shown in FIG. 7. In this embodiment of the present disclosure, a plurality of bit lines form the bit line layer 200.

In some embodiments, the forming process of the semiconductor structure includes forming a stack structure on the substrate 100. After the stack structure is formed, a transistor 600, storage nodes, word line structures, and the like may be further formed. In an exemplary embodiment, the stack structure includes a first sacrificial layer 301, a second sacrificial layer 302 and a dielectric layer 340, and the first sacrificial layer 301 is closer to the bit line relative to the second sacrificial layer 302. For example, the stack structure may be a structure consisting of an oxide layer, a silicon nitride layer, and an oxide layer in sequence. The top oxide layer may form the dielectric layer 340.

Figure 8:
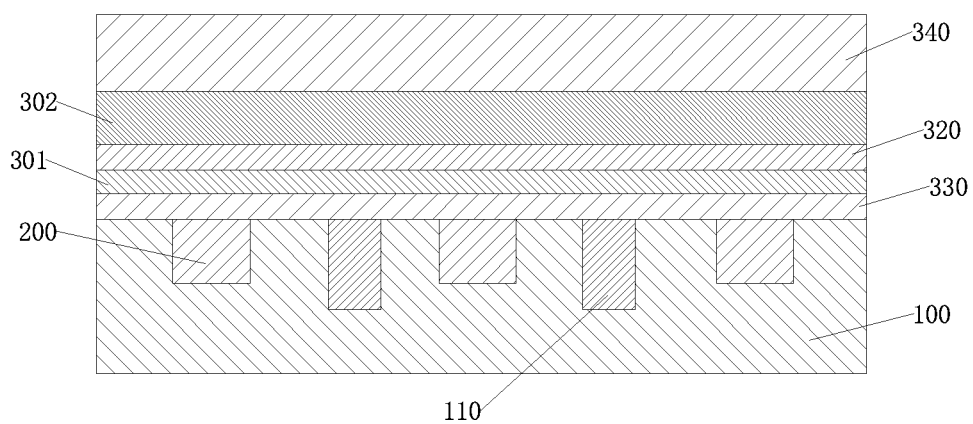

In a specific implementation of forming a stack structure on the substrate 100, a first insulating layer 330, a first sacrificial layer 301, a second insulating layer 320, a second sacrificial layer 302 and a dielectric layer 340 are sequentially formed on the substrate 100, to obtain the structure shown in FIG. 8.

In other exemplary embodiments, the second sacrificial layer in the stack structure in the foregoing embodiment may be replaced with a conductive layer 309. By forming a word line isolation recess, the conductive layer may be partitioned into a plurality of word lines, to form the word line layer. For example, the stack structure formed on the substrate 100 may include a first sacrificial layer 301, a conductive layer 309 and a dielectric layer 340. The first sacrificial layer 301 may be closer to the bit lines than the conductive layer 309. During specific implementation, the stack structure formed on the substrate 100 may include a first insulating layer 330, a first sacrificial layer 301, a second insulating layer 320, a conductive layer 309 and a dielectric layer 340 sequentially formed. The word line isolation recess is formed in the stack structure, and parts of the conductive layer 309 partitioned by the word line isolation recess form the word line layer. The word line isolation recess partitions the conductive layer into a plurality of word lines, thereby forming the word line layer.

In some embodiments, the forming process of the semiconductor structure includes forming a transistor 600. The transistor 600 is formed in the stack structure. In an exemplary embodiment, the transistor 600 is formed before the word line layer 310 is formed. Specifically, the word line isolation recess 307 may be formed before the stack structure is formed.

In some embodiments, the step of forming a transistor 600 includes: forming a transistor forming hole 304 in the stack structure, where a bottom of the transistor forming hole 304 exposes the bit line layer 200. The transistor 600 is formed in the transistor forming hole 304. The transistor 600 is connected to the bit line.

Figure 9:
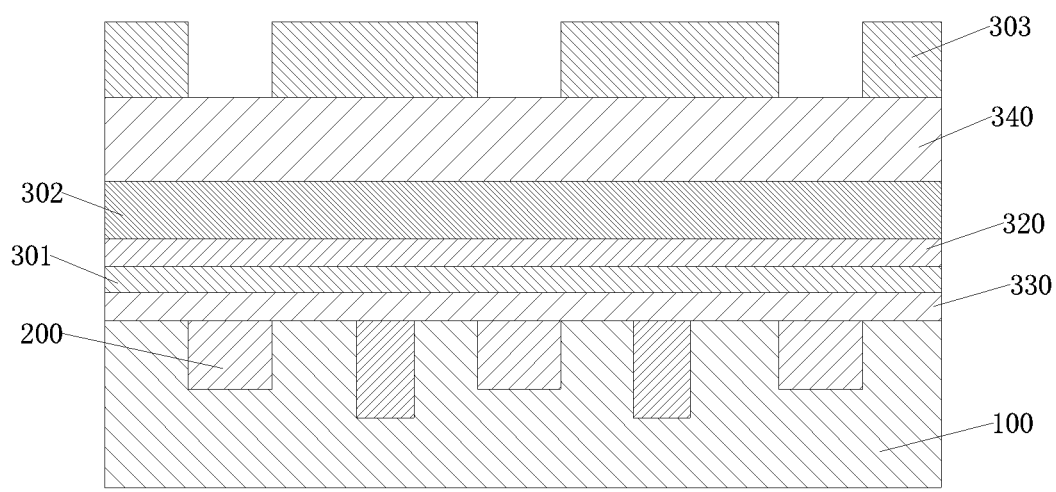
Figure 10:
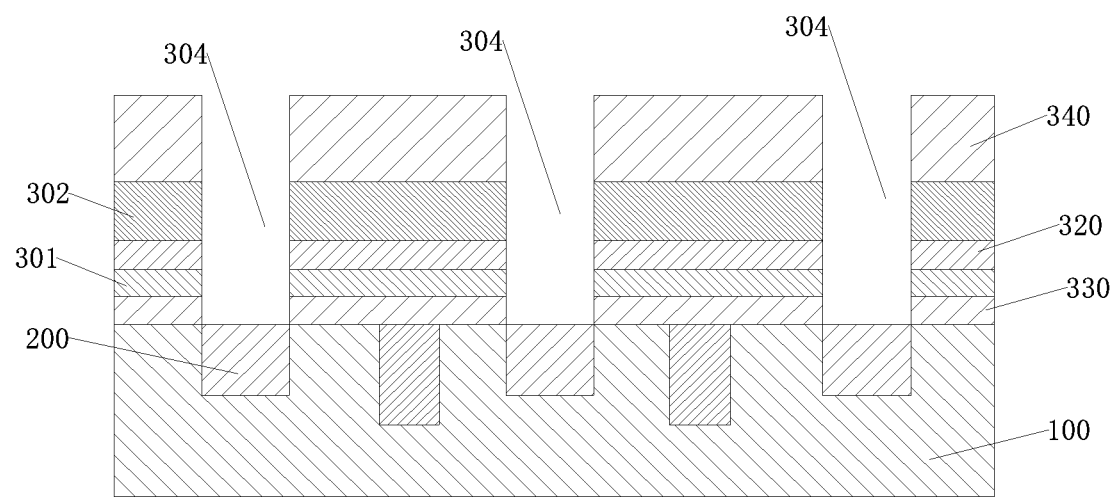

In a specific implementation of forming the transistor 600, referring to FIG. 9, a third photoresist layer 303 is provided on the stack structure, a pattern is defined on the third photoresist layer 303, and the stack structure is etched with the patterned third photoresist layer 303 as a mask, to form the transistor forming hole 304 in the stack structure; the bottom of the transistor forming hole 304 exposes the bit line layer 200, and the third photoresist layer 303 is removed to obtain the structure shown in FIG. 10. The pattern defined in this structure can be directly defined through illumination, or may be implemented by performing a pitch double method on a pattern that is defined through illumination.

Figure 11:
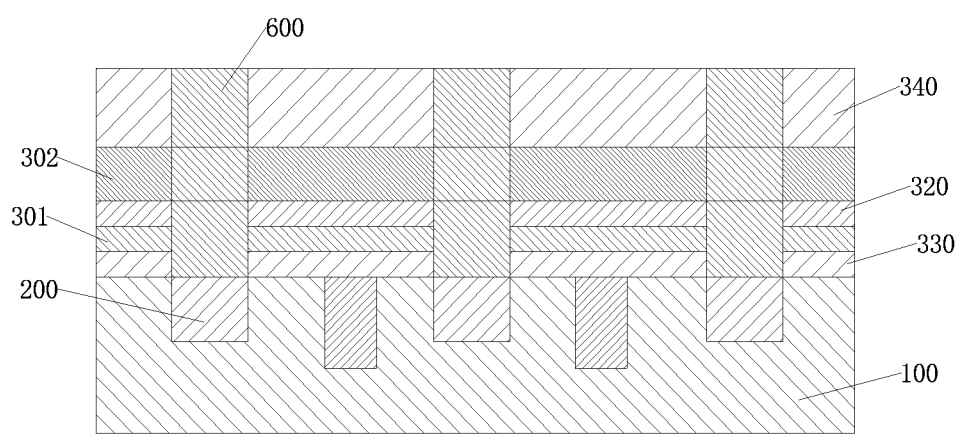

In an exemplary embodiment, the transistor 600 is formed in the transistor forming hole 304 through SEG, to obtain the structure shown in FIG. 11.

In some embodiments, each transistor 600 includes a source 630, a channel region 620, and a drain 610 that are stacked on the bit line; the source 630 and the drain 610 are formed by doping a semiconductor column formed in the transistor forming hole 304 through SEG. In an exemplary embodiment, during the epitaxial growth, doped growth is performed on parts corresponding to the source 630 and the drain 610 respectively, to form the source 630 and the drain 610. In an exemplary embodiment, doped growth is performed on a part between the bit line layer 200 and the second sacrificial layer 302, to form the source 630 of the transistor 600; doped growth is performed on a part above the second sacrificial layer 302, to form the drain 610 of the transistor 600, and a part corresponding to the second sacrificial layer 302 forms the channel region 620 of the transistor 600. The drain 610 and the source 630 each may be doped with different elements as required.

In some embodiments, the step of forming a word line stack layer 300 on the substrate 100 includes: forming a stack structure on the substrate 100, where for details of the stack structure, reference may be made to related parts in other embodiments; forming a word line isolation recess 307 in the stack structure; removing the second sacrificial layer 302 through the word line isolation recess 307, and forming a word line trench 308; forming a conductive layer 309 through the word line isolation recess 307, where the conductive layer 309 fills the word line trench 308 and the word line isolation recess 307; and removing a part of the conductive layer 309 outside the word line trench 308, and forming a word line layer 310.

Figure 12:
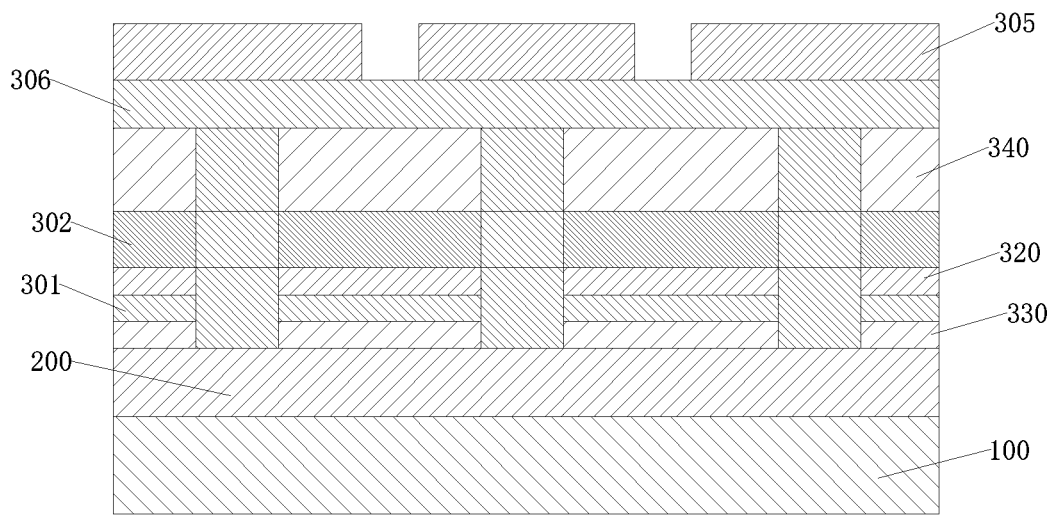
Figure 13:
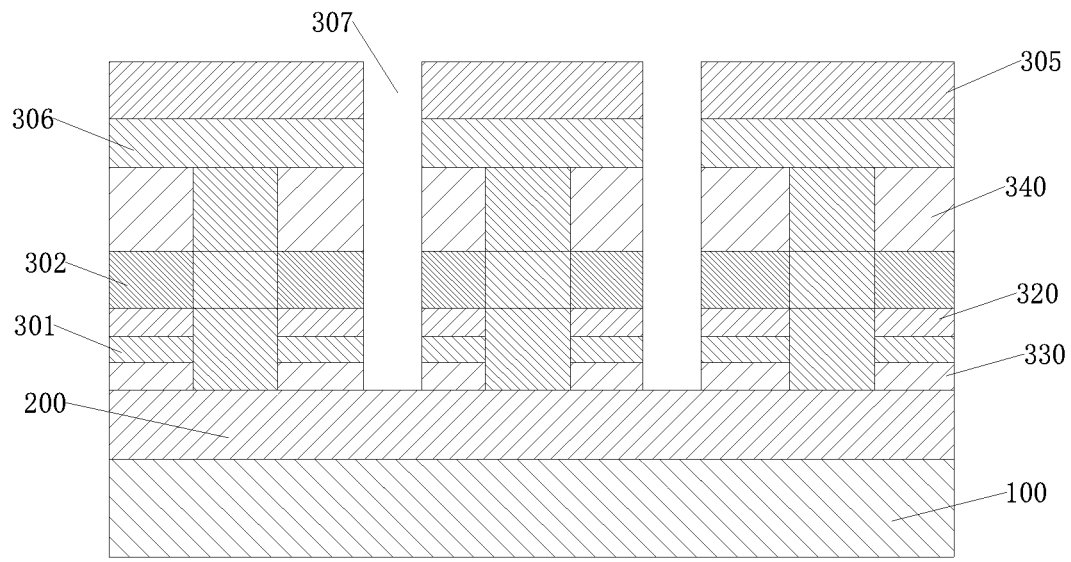
Figure 14:
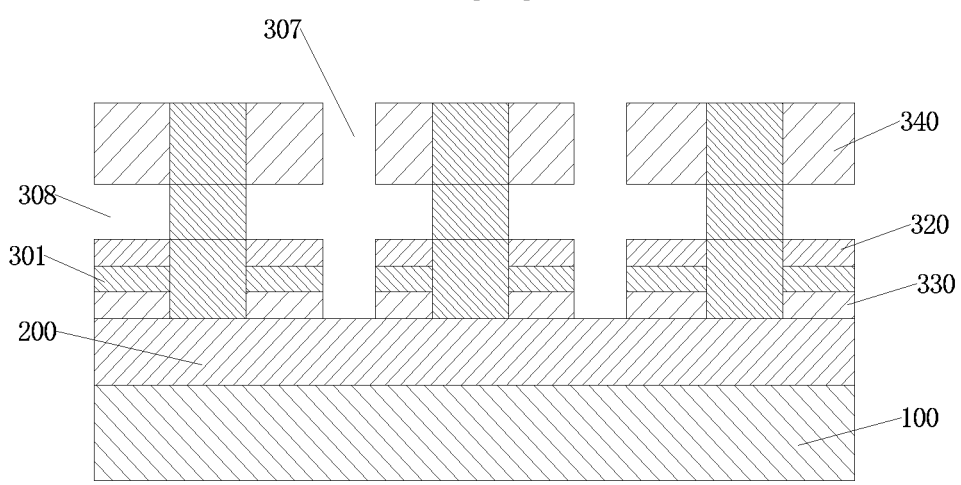
Figure 15:
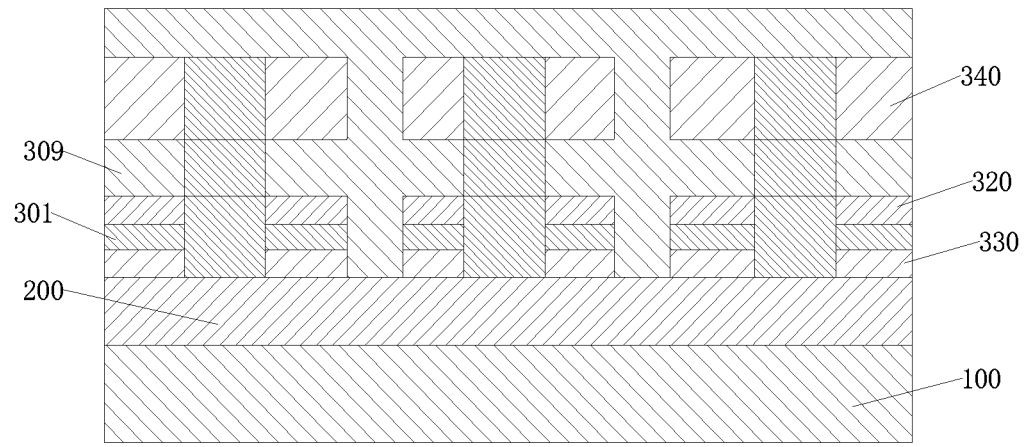
Figure 16:
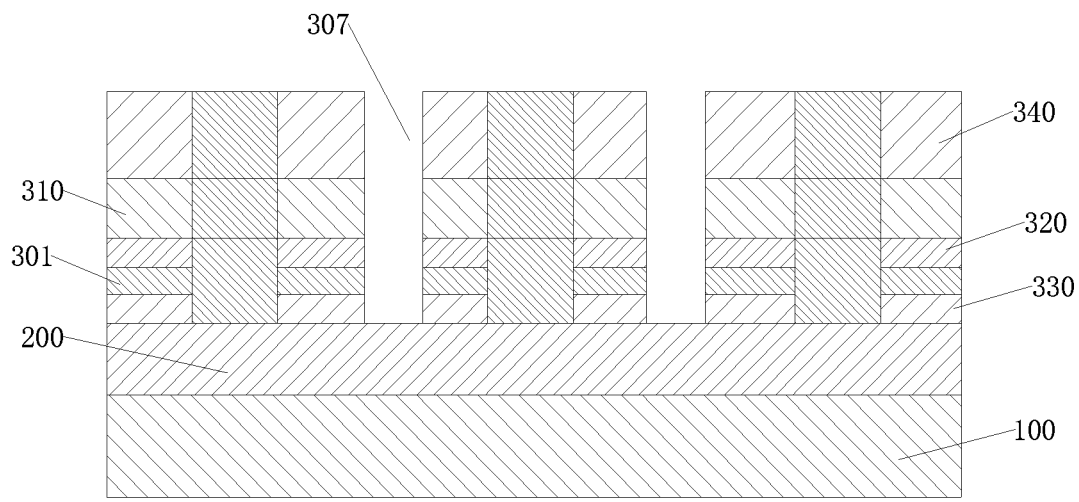

In a specific implementation of forming a word line stack layer 300 on the substrate 100, referring to FIG. 12, the cross section in FIG. 12 is perpendicular to the cross sections in FIG. 1 to FIG. 11, in order to clearly describe the changes in the manufacturing process of the semiconductor structure. A second hard mask layer 306 and a fourth photoresist layer 305 are sequentially provided on the stack structure; a pattern is defined on the fourth photoresist layer 305, and the second hard mask layer 306 is further etched; the stack structure is etched with the patterned second hard mask layer 306 as a mask, to form the word line isolation recess 307 in the stack structure, where the word line isolation recess 307 exposes the stack structure and the substrate 100, thus obtaining the structure shown in FIG. 13. The pattern defined in this structure can be directly defined through illumination, or may be implemented by performing a pitch double method on a pattern that is defined through illumination. The second sacrificial layer 302 is removed through the word line isolation recess 307, to form the word line trench 308; the fourth photoresist layer 305 and the second hard mask layer 306 are removed, to obtain the structure shown in FIG. 14. The conductive layer 309 is formed through the word line isolation recess 307, and the conductive layer 309 fills the word line trench 308 and the word line isolation recess 307, to obtain the structure shown in FIG. 15. The step of removing a part of the conductive layer 309 outside the word line trench 308 includes removing a part of the conductive layer 309 inside the word line isolation recess 307 and removing a part of the conductive layer 309 at the top of the stack structure, to form the word line layer 310, thus obtaining the structure shown in FIG. 16.

In other exemplary embodiments, for example, the second sacrificial layer 302 in the stack structure in the foregoing embodiments is replaced with the conductive layer 309. Specifically, the stack structure formed on the substrate 100 may include a first sacrificial layer 301, a conductive layer 309 and a dielectric layer 340. The first sacrificial layer 301 may be closer to the bit lines than the conductive layer 309. During specific implementation, the stack structure formed on the substrate 100 may include a first insulating layer 330, a first sacrificial layer 301, a second insulating layer 320, a conductive layer 309 and a dielectric layer 340 sequentially formed. The word line isolation recess is formed in the stack structure, and parts of the conductive layer partitioned by the word line isolation recess form the word line layer. The word line isolation recess partitions the conductive layer into a plurality of word lines, thereby forming the word line layer.

Figure 18:
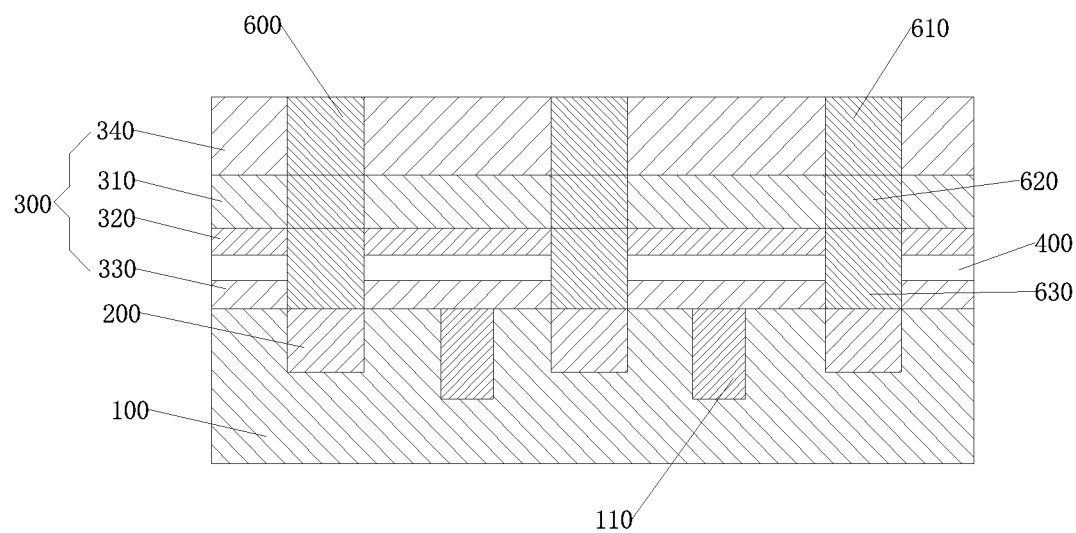

In some embodiments, the step of forming a gap 400 between the bit line layer 200 and the word line layer 310 includes: removing the first sacrificial layer 301 through the word line isolation recess 307 in which the conductive layer 309 has been removed, to form the gap 400. The first sacrificial layer 301 is removed to obtain the structure shown in FIG. 17 and FIG. 18. FIG. 17 and FIG. 18 are two schematic structural diagrams of cross sections perpendicular to each other.

In some embodiments, after the step of forming a gap 400 between the bit line layer 200 and the word line layer 310, the forming method further includes: forming an isolation layer 800 in the word line isolation recess 307. A dielectric material is deposited in the word line isolation recess 307 to form the isolation layer 800. The isolation layer 800 seals an edge of the gap 400 connected to the isolation layer 800.

In an exemplary embodiment, the word line isolation recess 307 is filled with the isolation layer 800 to form the structure shown in FIG. 19.

In another exemplary embodiment, the isolation layer 800 is formed on a recess wall of the word line isolation recess 307, and the isolation layer 800 is of a hollow structure, to obtain the structure shown in FIG. 20. A hollow part inside the isolation layer 800 has a relatively low dielectric constant, which can reduce the parasitic capacitance.

In the embodiments of the present disclosure, a material of the sacrificial layer (including the first sacrificial layer 301 and the second sacrificial layer 302) is not limited. For example, the sacrificial layer may be an oxide layer, a nitride layer, a carbon layer or the like. A material of the hard mask layer (including the first hard mask layer 102 and the second hard mask layer 306) is not limited. For example, the mask layer may be a silicon nitride layer.

According to a third aspect, an embodiment of the present disclosure provides a memory, including the semiconductor structure according to any one of the foregoing embodiments.

Described above are merely exemplary embodiments of the present disclosure, which cannot be construed as a limitation on the scope of the present disclosure. Any equivalent changes and modifications made in accordance with the teachings of the present disclosure still fall within the scope of the present disclosure. A person skilled in the art can easily think of other implementation solutions of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the scope and spirit of the present disclosure are defined by the claims.

The invention claimed is:

1. A semiconductor structure, comprising:
   a substrate;
   a bit line layer, located in the substrate;
   a word line stack layer, located on the substrate, wherein the word line stack layer comprises a word line layer, wherein the word line stack layer further comprises:
   a first insulating layer, located on the bit line layer, a second insulating layer, located under the word line layer and a dielectric layer, located on the word line layer;
   a transistor comprises a source, a channel region and a drain sequentially stacked on a bit line from the bit line layer, wherein the source penetrating the first insulating layer and the second insulating layer, the channel region penetrating the word line layer, and the drain penetrating the dielectric layer, the source of the transistor is connected to the bit line; and
   a gap, located between the first insulating layer and the second insulating layer, wherein the gap is in direct contact with and surrounds the source.

2. The semiconductor structure according to claim 1, further comprising:
   a word line isolation recess, located in the word line stack layer, wherein the word line isolation recess isolates two adjacent word lines; and
   an isolation layer, located in the word line isolation recess.

3. The semiconductor structure according to claim 2, wherein
   the isolation layer is located on a recess wall of the word line isolation recess, and the isolation layer is of a hollow structure.

4. A memory, comprising
   the semiconductor structure according to claim 1.

5. The semiconductor structure according to claim 1, the substrate further comprising an isolation region, the isolation region isolates two adjacent bit lines.

* * * * *